(12) United States Patent
Verschuren et al.

(10) Patent No.: US 9,070,902 B2
(45) Date of Patent: Jun. 30, 2015

(54) PATTERNED LED DEVICE, METHOD OF GENERATING A PATTERNING, SYSTEM AND METHOD OF CALIBRATING THE SYSTEM

(75) Inventors: Coen A. Verschuren, Eindhoven (NL); Margaretha M. De Kok, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 151 days.

(21) Appl. No.: 13/131,638

(22) PCT Filed: Nov. 30, 2009

(86) PCT No.: PCT/IB2009/055415
§ 371 (c)(1),
(2), (4) Date: May 27, 2011

(87) PCT Pub. No.: WO2010/064190
PCT Pub. Date: Jun. 10, 2010

(65) Prior Publication Data
US 2011/0227117 A1    Sep. 22, 2011

(30) Foreign Application Priority Data
Dec. 5, 2008    (EP) .................................. 08170764

(51) Int. Cl.
*H01L 33/36* (2010.01)
*H01L 51/52* (2006.01)

(52) U.S. Cl.
CPC .................................. *H01L 51/5271* (2013.01)

(58) Field of Classification Search
CPC .......... H01L 33/36; H01L 33/52; H01L 33/00
USPC ............. 257/98, 72, 59, 443, 86, 84, 103, 79, 257/88, 82, 83
See application file for complete search history.

(56) References Cited

U.S. PATENT DOCUMENTS

| 6,682,863 | B2 | 1/2004 | Rivers et al. | |
| 7,063,990 | B2 | 6/2006 | Rivers et al. | |
| 7,973,880 | B2 * | 7/2011 | Sumida et al. | 349/65 |
| 8,605,234 | B2 * | 12/2013 | Verschuren et al. | 349/65 |

(Continued)

FOREIGN PATENT DOCUMENTS

| EP | 1643809 A1 | 4/2006 |
| JP | 2003036969 | 2/2003 |

(Continued)

*Primary Examiner* — Chuong A Luu
(74) *Attorney, Agent, or Firm* — Meenakshy Chakravorty

(57) ABSTRACT

A patterned light emitting diode device includes a layer of light emitting material between an anode and a cathode. Further, a light-reflective layer is visible through a light-emission window of the patterned light emitting diode device. The light-reflective layer includes a pattern formed by local deformations of the light-reflective layer. The pattern may be generated via impinging condensed light beam which may enter via a rear-wall of the light-reflective layer, or via impinging the condensed light beam through the light-emission window on the light-reflective layer. The deformations may be generated without significantly altering the conductivity of the light-reflective layer. An effect of this patterned light emitting diode device is that the pattern remains clearly visible both during an on-state and during an off-state of the light emitting diode device.

15 Claims, 8 Drawing Sheets

(56) References Cited

U.S. PATENT DOCUMENTS

| | | | |
|---|---|---|---|
| 2002/0043931 A1* | 4/2002 | Minoura et al. | 313/506 |
| 2004/0119028 A1 | 6/2004 | McCormick et al. | |
| 2004/0217681 A1* | 11/2004 | Park et al. | 313/110 |
| 2004/0217702 A1* | 11/2004 | Garner et al. | 313/512 |
| 2005/0161693 A1* | 7/2005 | Sugiura et al. | 257/98 |
| 2006/0063096 A1 | 3/2006 | Lee et al. | |
| 2006/0063097 A1 | 3/2006 | Lee et al. | |
| 2006/0205101 A1 | 9/2006 | Lee et al. | |
| 2007/0290607 A1* | 12/2007 | Okada et al. | 313/504 |
| 2011/0228551 A1* | 9/2011 | Verschuren et al. | 362/555 |

FOREIGN PATENT DOCUMENTS

| | | |
|---|---|---|
| JP | 2006164808 | 6/2006 |
| JP | 2007284310 A | 11/2007 |
| JP | 2007326119 A | 12/2007 |
| JP | 2008192613 | 8/2008 |
| WO | 2005025276 A1 | 3/2005 |
| WO | 2007050023 A1 | 5/2007 |
| WO | 2008122920 A2 | 10/2008 |

\* cited by examiner

PATTERNED LED DEVICE, METHOD OF GENERATING A PATTERNING, SYSTEM AND METHOD OF CALIBRATING THE SYSTEM

FIELD OF THE INVENTION

The invention relates to a patterned light emitting diode device.

The invention also relates to a method of generating a pattern in a light emitting diode device, to a system for generating the patterned light emitting diode device, and a method of calibrating the system.

BACKGROUND OF THE INVENTION

Organic light emitting diode device (further also referred to as OLED devices) typically comprises a cathode, an anode, an emissive layer and a conductive layer. These parts can be positioned on a substrate. The emissive and conductive layers are manufactured of organic material that can conduct an electric current. When a voltage is applied across the cathode and anode, electrons travel from the cathode towards the anode. Furthermore, holes are created in the conductive layer at the anode side and propagate towards the cathode. When electrons and holes recombine, photons are created and emitted from the OLED device.

OLED devices are in many ways considered as the future in various lighting applications. They may, for instance, be used to create ambient lighting. Full 2-dimensional grey-level pictures may be patterned in a single OLED device, while maintaining all intrinsic advantages of OLED devices, for instance, being appealing, being a diffuse area light source and so on.

An example of patterned OLED devices is presented in the US 2004/0119028 document. In these known OLED devices an encapsulated small molecule OLED device has been irradiated with a laser beam having a wavelength in the infrared spectrum, decreasing the electroluminescence in the areas exposed to the laser.

A disadvantage of these known patterned OLED devices is that the patterned part of the OLED device is not clearly visible when the device is not in operation.

SUMMARY OF THE INVENTION

It is an object of the invention to provide a patterned light emitting diode device in which the pattern is clearly and permanently visible.

According to a first aspect of the invention the object is achieved with a patterned light emitting diode device comprising a layer of light emitting material and comprising a light-reflective layer being visible through a light-emission window of the patterned light emitting diode device, the light-reflective layer comprising a pattern constituted of local deformations of the light-reflective layer. According to a second aspect of the invention, the object is achieved with a method of generating a patterned light emitting diode device that includes locally deforming the light-reflective layer for generating deformations constituting the pattern. According to a third aspect of the invention, the object is achieved with a system for generating the patterned light emitting diode device. According to a fourth aspect of the invention, the object is achieved with a method of calibrating the system for generating the patterned light emitting diode device.

The patterned light emitting diode device according to the first aspect of the invention comprises a layer of light emitting material and comprises a light-reflective layer being visible through a light-emission window of the patterned light emitting diode device, the light-reflective layer comprising a pattern constituted of local deformations of the light-reflective layer.

An effect of the patterned light emitting diode device according to the invention is that the pattern constituted of deformations is permanently visible during both an off-state of the patterned light emitting diode device and during an on-state of the patterned light emitting diode device. During the off-state the patterned light emitting diode device does not emit light and the pattern is visible on the patterned light emitting diode device due to the difference in scattering of external light from the deformations, providing an attractive scattering metallic appearance. During the on-state the patterned light emitting diode device emits light and the pattern remains visible due to the different scattering of light generated by the patterned light emitting diode device as well as external light impinging at the location of the pattern due to the deformations. In the known OLED devices the patterning is performed by directly adapting the light emitting material. As this may be beneficial for polymer OLED device, the application of this principle for small molecule OLED devices (further also indicated as smOLED) is limited as the light emitting material in smOLED devices is much more stable and thus is much more difficult to locally adapt without damaging any of the remaining material layers of the smOLED device. As such, the known patterning via irradiation of infrared laser light as disclosed in the US 2004/0119028 may not generate a pattern in smOLED devices at all. Furthermore, the known adaptation of the light emitting material of the OLED devices typically locally reduces the emission of light at the pattered regions, thus reducing the overall emission of light while the pattern in an off-state of the OLED device is relatively poorly visible: the area merely shows some discoloration compared to the unpatterned areas of the device. In the light emitting diode device according to the invention, the pattern is generated by deforming the light-reflective layer which is visible through a light-emitting window of the patterned light emitting diode device. As such, the generation of the pattern according to the invention would not be different for polymer OLED devices or for smOLED devices as the pattern is generated at the light-reflective layer. Furthermore, due to the light-reflective layer being visible through the light-emitting window, the deformations are both visible in the off-state of the light emitting diode device via scattering of external light and during the on-state of the light emitting diode device via scattering of the light generated by the light emitting diode device and via scattering of external light.

Furthermore, the light emitting diode device according to the invention may both be, for example, either a polymer OLED device or a small molecule OLED device. As the pattern is not generated in the light emitting material but rather in the light-reflective layer, the pattern may be generated with substantially the same effort in both the polymer OLED devices and the small molecule OLED devices. As such, by applying the pattern in the light-reflective layer rather than in the light emitting material, the pattern may be applied in either of the polymer OLED devices and the small molecule OLED devices via substantially the same methods and/or tools.

In an embodiment of the patterned light emitting diode device, light emitting material of the light emitting diode device is arranged between an anode layer and a cathode layer, the anode layer or cathode layer being the light-reflective layer comprising the pattern constituted of deformations while substantially maintaining a conductivity of the light-reflective layer parallel to the light-reflective layer.

Substantially maintaining the conductivity of the light-reflective layer indicates that the overall conductivity across the light-reflective layer is maintained while, for example, minute holes and/or cracks may appear. Although in a preferred embodiment of the patterned light emitting diode device, no holes and/or cracks are present in the light-reflective layer as they would poorly reflect the light, the patterned light emitting diode device still operates with these minute holes and/or cracks present. The quality of the pattern may be reduced due to these minute holes and/or cracks reducing the attractive metallic appearance of the pattern. Minute holes and/or cracks preferably have dimensions which are not visible by the naked human eye and/or may have dimensions, for example, smaller than 100 µm, and more preferably smaller than 10 µm.

The light emitting material may, for example, be organic light emitting material. Such organic light emitting diode device is an area light source in contrast to standard LEDs. Such area light sources are becoming more popular in, for example, decorative applications. Visually appealing patterning offers further customization/personalization of such area light source. The organic layer enables the presence of the deformations as the organic layer constitutes a plastically deformable ('compliant') layer.

Preferably the deformations in the light-reflective layer being the anode-layer or cathode-layer is done without damaging any of the layers of the light emitting diode device which are used for the light emission. As the deformations are generated in the anode-layer or cathode-layer such that substantially the conductivity of the light-reflective layer is maintained, the whole light emitting surface of the light emitting diode device will radiate light while the pattern remains visible.

In an embodiment of the patterned light emitting diode device, the pattern comprises a plurality of grey-levels, the different grey-levels comprising a different density of the deformations of the light-reflective layer, and/or comprising a different height of the deformations of the light-reflective layer, the height being a dimension substantially perpendicular to the light-reflective layer.

Substantially perpendicular to the light-reflective layer is used to express that the direction in which the height of the deformations is measured is substantially perpendicular to an average plane through the light-reflective layer rather than perpendicular to the light-reflective layer at the location of a deformation, which is not well defined due to the not well-defined shape of the deformations.

The scattering appearance of the pattern alters with the density of the deformations and/or with the difference in height of the deformations. This density and/or height differences may be altered continuously or in discrete steps defining a range of grey-levels in the pattern which may be used to generate the pattern. These density variations may be generated by simply generating more deformations per surface area. Especially when the deformations are so small that the individual deformations cannot be seen by the naked human eye, the density variations clearly generate differently perceived patterns which are perceived as grey-levels. Also differences in height are perceived different and may contribute to the differences in grey-levels.

In an embodiment of the patterned light emitting diode device, the light-reflective layer is configured to be locally irradiated with electro-magnetic radiation for locally heating the light-reflective layer for locally deforming the light-reflective layer. A benefit of this embodiment is that the irradiation with electro-magnetic radiation may be relatively simple as intense sources of condensed electro-magnetic radiation are currently readily available, for example, using condensed light emitting diodes as light source, or, for example, using laser light sources.

Alternatively, the local deformations may have been generated by applying a stamp comprising the pattern or a negative of the pattern or comprising part of the pattern to the light-reflective layer of the light emitting diode device. This may, for example, have been done during the production process immediately after having applied the light-reflective layer to the device and before applying a next layer in the production process. Generally an additional compliant layer is required for allowing the light-reflective layer to be deformed without short-circuiting the remainder of the light emitting diode device.

In an embodiment of the patterned light emitting diode device, the light-reflective layer is configured for being locally deformed when irradiated with electro-magnetic radiation having a power below an ablation threshold of any of the layers of the patterned light emitting diode device. By maintaining the power below the ablation threshold of any of the layers of the patterned light emitting diode device, any local damage to any of the layers of the patterned light emitting diode device is prevented. Power is determined via the intensity of the electro-magnetic radiation, via the speed that the beam of electro-magnetic radiation is moved across the organic light emitting diode device, via the wavelength of the electro-magnetic radiation, and via the focus dimension of the electro-magnetic radiation applied to the light emitting diode device.

In an embodiment of the patterned light emitting diode device, a wavelength of the electro-magnetic radiation for generating the deformations is in a range between 320 nanometers and 2000 nanometers. Generally using a wavelength in which laser light sources are commonly available enables relatively simple and cheap systems for generating the pattern into the light-reflective of the light emitting diode device. Such wavelength may, for example, be 405 nanometers emitting laser diode or a 532 nanometers emitting YAG laser. Laser systems operating in the infrared part of the spectrum can be used as well, since the patterning relies on a localized heating of the light-reflective layer.

In an embodiment of the patterned light emitting diode device, the patterned light emitting diode device comprises an anode layer and a cathode layer, and wherein at least a part of the anode layer or the cathode layer is configured to be substantially transparent to the electro-magnetic radiation. Such an embodiment enables that the patterning may be performed after the light emitting diode device has been produced in, for example, a substantially standard production process. As the anode layer and/or cathode layer are at least partially transparent to the electro-magnetic radiation used to generate the pattern, the pattern may be applied after the anode and/or cathode layer have been applied on the light emitting diode device to generate the patterned light emitting diode device.

In an embodiment of the organic light emitting diode device, the patterned light emitting diode device is sealed in an encapsulation, and wherein at least a part of the encapsulation is configured to be substantially transparent to the electro-magnetic radiation.

So the patterning may be performed even after the light emitting diode device has been manufactured and completely sealed in the encapsulation. As such, the light emitting diode device may be an off the shelf product and may be customized by applying the pattern and generate the patterned light emitting diode device even after the light emitting diode device has been sealed in the encapsulation. This is very beneficial, especially when the light emitting diode device is a small molecule organic light emitting diode device, as this enables to use, for example, a simple printing step using a laser diode of the appropriate wavelength and intensity to generate the pattern also in small molecule organic light emitting diode devices. In the known patterning methods in which the light emitting material is influenced to generate the pattern, this was substantially not possible due to the high stability of the small molecule organic light emitting diode devices. In the current patterned light emitting diode device in which not the light emitting material but deformations in the light-reflective layer is generated for forming the pattern, the customized patterning using a relatively simple laser-patterning system is again possible. A benefit when using small molecule organic light emitting diode devices is that the long term stability of small molecule organic light emitting diode devices is currently much better compared to, for example, the polymer organic light emitting diode devices. A further benefit of small molecule organic light emitting diode devices is that the efficiency of the small molecule organic light emitting diode devices is much better—currently about 5 to 10 times better compared to comparable polymer organic light emitting diode devices.

The method of generating a patterned light emitting diode device according to the second aspect of the invention comprises a patterned light emitting diode device comprising a layer of light emitting material and comprising a light-reflective layer being visible through a light-emission window of the patterned light emitting diode device, the method of generating comprises the step of: locally deforming the light-reflective layer for generating deformations constituting the pattern. The inventors have found that the applying of local deformations in the light-reflective layer may be used to generate a permanently visible pattern on a light emitting diode device which is visible both in the on-state and off-state of the light emitting diode device. As such, the resulting patterned light emitting diode device comprises an attractive metallic appearance in which at least the unpatterned part of the light emitting material of the light emitting diode device remains emitting light in the on-state of the patterned light emitting diode device.

In an embodiment of the method of generating, the step of locally deforming comprises:

an illumination step for illuminating part of the light-reflective layer with electro-magnetic radiation for generating the pattern, the electro-magnetic radiation locally altering a temperature of the light-reflective layer for deforming the light-reflective layer while having a power below an ablation threshold of any of the layers of the light emitting diode device, and/or a stamping step for generating the pattern by pressing a stamp comprising the pattern or a further pattern to the light-reflective layer.

The illumination step may be via using a mask, e.g. a mask used in the lithography techniques for generating a pattern. In such a step, the mask may be projected on the light-reflective layer via a projection tool. Alternatively, the illumination step may, for example, be performed via a scanning collimated light beam such as a laser beam. The illumination step may alter the light-reflective layer to generate the deformations, or, alternatively, the illumination step may be followed by an etching step via which the deformations are generated in the light-reflective layer.

In an embodiment of the method of generating, the illumination step comprises locally illuminating the light-reflective layer with a condensed light beam. A benefit of this embodiment is that the use of a condensed light beam, for example, a laser beam, enables a relatively simple method of generating the pattern. Furthermore, the use of a scanning condensed light beam enables the applying of local intensity variations in the applied illumination which enables the altering the density and/or height of the deformations which enables different grey-levels to be applied in the pattern applied on the light emitting diode devices.

In an embodiment of the method of generating, the step of locally deforming the light-reflective layer is performed during a production process of the light emitting diode device. A benefit of this embodiment is that substantially no other material layers may be present when patterning the light-reflective layer which other material layer may also have been influenced by, for example, impinging light. Furthermore, the production process of the light emitting diode devices is typically a well controlled production process. Performing the patterning step during the production process generally enables the production process to be adapted such that the life-time of the device is only marginally influenced or not influenced at all due to the patterning.

A drawback is that the production of the patterned light emitting diode device is typically on a relatively large scale. Often the patterning of the light emitting diode devices is required on smaller scales compared to the typical production scale of light emitting diode devices. As such, a production of the pattern in the light emitting diode device outside the production process may be preferred for small quantities.

In an embodiment of the method of generating, the patterned light emitting diode device comprises an anode layer and a cathode layer, and wherein at least a part of the anode layer and/or the cathode layer of the light emitting diode device are configured to be substantially transparent to electro-magnetic radiation, the step of locally deforming the light-reflective layer being performed by irradiating the light-reflective layer with a condensed light beam through the anode layer or through the cathode layer. As such, the patterning may be performed also after the anode and/or cathode layer have been applied on the organic light emitting diode device. Thus the patterning may be performed after the light emitting diode device has been produced, enabling the light emitting diode devices to be generated via substantially standard production processes without being patterned and only pattern the light emitting diode device with the pattern when required; thus reducing the overall cost of the individual light emitting diode devices.

Alternatively, the light-reflective layer may be at the opposite side of the light emitting diode device compared to the light-emission window and the pattern may be generated through a backside of the light emitting diode device on the light-reflective layer. In such an embodiment, the remaining layers of the light emitting diode device do not need to be transparent to the condensed light beam and the transmission of the high-power condensed light beam through the remainder of the layers of the light emitting diode device would not damage any of the layers of the light emitting diode device.

In an embodiment of the method of generating, the light emitting diode device is sealed in an encapsulation, at least a part of the encapsulation being configured to be substantially transparent to the electro-magnetic radiation, and wherein the step of locally deforming the light-reflective layer comprises irradiating the light-reflective layer with a condensed light beam through the encapsulation. Generally, light emitting diode devices are encapsulated to protect the light emitting diode device against the environment, especially moisture which may damage to, for example, organic light emitting diode device. Due to the partial transparency of the encapsulation of the light emitting diode device, the patterning may be done through the encapsulation and as such may be done on the substantially finished and sealed light emitting diode device. The light emitting diode devices may be produced in a fully standardized production process and fully sealed for storage. Subsequently, when required, the pattern may be applied through the encapsulation of the light emitting diode device.

Also this irradiation of the condensed light beam through the at least part of the encapsulation may result in irradiating the light-reflective layer through the light-emission window or through the backside of the light emitting diode device.

In an embodiment of the method of generating, the step of locally deforming the light-reflective layer comprises a step of varying a density of the local deformations for generating a plurality of grey-levels and/or comprising a step of varying a height of the deformations for generating a plurality of grey-levels, the different grey-levels each comprising different levels of density of the deformations and/or different height of the deformations on the light-reflective layer the height being a dimension substantially perpendicular to the light-reflective layer. These locally different deformation densities and/or height differences generate different grey-levels in the pattern, thus enabling to generate the image using a large range of grey-levels. The third aspect of the invention comprises a system for generating a patterned light emitting diode device, and/or for performing the method of generating a patterned light emitting diode device. The system may, for example, be arranged for generating the deformations either via the light-emission window or via a back-side of the light emitting diode device at an opposite side of the light emitting diode device with respect to the light-emission window. Such a system able to generate the deformations via the back-side of the light emitting diode device avoids generating the deformations through the light emitting layers of the light emitting diode device, thus avoiding damaging the light emitting layers.

In an embodiment of the system, the system comprises radiation means for generating a condensed light beam and scanning means for moving the condensed light beam across a light emitting diode device for generating the patterned light emitting diode device. The condensed light beam comprises light having a wavelength in a range between 320 nanometers and 650 nanometers and preferably comprises light having a wavelength of approximately 2000 nanometers. Light from the indicated wavelength range may be relatively easily obtained as in this wavelength range many laser light sources are available. Especially at 405 nanometers relatively powerful and low-cost laser-diodes are available, as these are also used in optical disc playback and recording equipment such as Blu-ray Disc.

The radiation means may, for example, be a pulsed light source, for example, a pulsed laser for generating the deformations constituting the pattern. Using a pulsed laser as the radiation means enables to more accurately locally increase the temperature compared to continuous laser sources which typically increased the temperature over a larger area, increasing the possibility of damaging any of the layers of the light emitting diode device.

In an embodiment of the system, the system comprises focusing means for controlling a focus location of the condensed light beam. A benefit of the system is that in such an arrangement, the condensed light beam may be focused at a different location in the device and as such, for example, apply the condensed light beam through an encapsulation of the light emitting diode device. Such a system may be used during the production of the light emitting diode device, after the light emitting diode device has been produced and even after the light emitting diode device has been encapsulated. Due to the variable location of the focus of the condensed light beam, the system may adapt to the situation and may be able to either focus through the anode and/or cathode layer and may, for example, be also focused through the encapsulation of the light emitting diode device. The latter enables to fully finish the production of the light emitting diode device and encapsulate the light emitting diode device before adapting the pattern.

In an embodiment of the system, the system comprises means for controlling the energy level, color and/or scanning speed of the condensed light beam. As indicated before, the inventors have found that the density and/or height of the deformations may be altered to different extents for generating grey-levels. However, to ensure that the power of the deposited light per illuminated area per time does not exceed a predefined power-level, the system may control the energy level, color and/or scanning speed of the condensed light beam.

In an embodiment of the system, the system further comprises input means for accepting an input-pattern for being applied on a light emitting diode device to generate the pattern, and comprises conversion means for converting the input-pattern into a movement of the condensed light beam and/or into a spot-size of the condensed light beam and/or into an intensity variation of the condensed light beam and/or into a color variation of the condensed light beam for generating the pattern. The input means for accepting the input-pattern may be a computer which uses a specific or generic format in which the input-pattern is provided by a user to the system and in which the computer comprises conversion means for converting the provided input-pattern into commands and/or driving signals for the system to generate the pattern of deformations in the light emitting diode device. Such a system would enable a patterning in which no masks are required which reduces the cost of the system. Furthermore, the input means for accepting the input-pattern enable to use this system also to generate small volume patterned light emitting diode devices in which a customer specific pattern may be provided electronically by the customer and which may simply be added to the system via electronic means. The input means may also be connected to a network environment, for example, the internet. In such an embodiment, a customer may order his customized patterned light emitting diode devices simply via internet and may upload the required input-pattern to the server of the manufacturer. After the light emitting diode devices device is patterned by locally applying the deformations, the patterned light emitting diode device may, for example, be shipped directly to the customer.

In an embodiment of the system, the input-pattern comprises a digital representation of the pattern. A benefit of such embodiment is that it allows an easy user interface. As described above, by providing a digital representation of the input-pattern to the system, for example, via uploading the digital representation of the input-pattern to a server, the user may relatively simply request a personalized patterned light emitting diode device via an internet connection. The digital representation may be in different formats in which the system may, for example, additionally comprise format converting software to convert the provided digital representation of the pattern into a representation which may directly be used by the system for generating the pattern of deformations on the light-reflective layer of the light emitting diode device.

In an embodiment of the system, the system further comprises calibration means for determining a spot-size of the condensed light beam and/or for determining a deformation-size in the pattern. The determination of the spot-size of the condensed light beam and/or the deformation-size of the resulting deformation may be done using a feedback system. Preferably such feedback system may comprise a camera which provides the feedback to a user. Alternatively, the feedback camera may be connected to image processing software via which the spot-size and/or deformation-size may be determined automatically. For determining the deformation-size in the deformations of the pattern, a test-pattern may be applied which is measured after the deformation has been generated. This measured deformation-size is used to determine the right conditions of the condensed light beam to be able to generate the required pattern. The magnification of such a feedback camera is preferably relatively high to enable the test-pattern to be relatively small as the test-pattern is preferably not visible to a user—either too small or arranged at an edge of the light emitting diode device which will, for example, be covered by some kind of frame in which the light emitting diode device is placed after the pattern has been applied.

In an embodiment of the system, the system comprises scan-control means for controlling a patterning speed of the system for generating the patterned organic light emitting diode device, the scan-control means being configured for dynamically controlling the spot-size of the condensed light beam while generating the pattern, the scan-control means is further configured for adapting an output power of the condensed light beam to ensure that a power per illuminated area remains substantially constant. The spot-size of the condensed light beam depends, for example, on the minimum feature size which must be patterned at the part of the pattern. The spot-size may also be chosen to be relatively small near edges of a pattern to obtain accurate placement of the edge of the pattern while the remainder of the pattern is generated using a larger spot-size having substantially the same power per illuminated area. By ensuring that the power per illuminated area remains substantially the same, the height and density of the deformations generated by the condensed light beam remains substantially constant both for the small spot-size when generating relatively small features and for the relatively large spot-size when patterning relatively large areas. Dynamically adapting the spot-size enables to place edges of relatively large features relatively accurately at the right location while relatively quickly patterning the remainder of the relatively large features, thus reducing the overall patterning time and increasing the speed of the generation of the pattern. The output power of the condensed light beam should increase quadratically with increasing beam diameter.

In an alternative embodiment of the system, the scan-control means is configured for controlling a further radiation means generating a further condensed light beam having a different spot-size compared to the radiation means, the system comprising the further radiation means and the scan-control means dynamically selecting the radiation means and/or the further radiation means while generating the pattern. Using a further radiation means emitting the further condensed light beam enables the system to quickly switch from one radiation means to the further radiation means thus changing the spot-size of the condensed light beam used for patterning to the current patterning requirements. A benefit of this embodiment is that substantially no mechanical elements are required to be moved for adapting the spot-size. The radiation means and/or further radiation means may be switched on and off by the scan-control means to select either of the condensed light beam and/or the further condensed light beam. Furthermore, the radiation means and further radiation means may have been calibrated before the patterning is started. As such, the spot-size of the condensed light beam and the further condensed light beam are well defined and may directly be used for patterning. This enables the quick switch over from one spot-size to another. Again, the smaller spot-size may be used for relatively small features and, for example, near edges of relatively large features to be patterned. For relatively large features or for patterning the remainder of relatively large features, the condensed light beam having the large spot-size may be used. The power per illuminated area preferably is maintained constant between the condensed light beam and the further condensed light beam.

In an alternative embodiment of the system, the scan-control means is configured for controlling the scanning means depending on the spot-size of the condensed light beam and/or the further condensed light beam and/or depending on the power per illuminated area emitted by the condensed light beam and/or the further condensed light beam. Adapting the scanning means in dependence of the spot-size or the power per illuminated area emitted by the condensed light beam and/or the further condensed light beam enables the scan-control means to substantially maintain the power per illuminated area per time substantially constant, thus preventing to locally overheating the light-reflective layer and thus preventing damaging the light-reflective layer. Furthermore, it enables to increase the scanning speed when the output power of the radiation means and/or further radiation means is increased, thus enabling to increase the patterning speed of the system according to the invention.

In an alternative embodiment of the system, the scan-control means is configured for skipping to scan the condensed light beam and/or the further condensed light beam across non-image-areas of the light emitting diode device for increasing a patterning speed, the non-image-areas do not require irradiation of the condensed light beam or of the further condensed light beam for generating the pattern. The system, for example, identifies non-image-areas before starting the patterning and, for example, adapts the patterning strategy such that these non-image-areas are not scanned. Such a patterning strategy reduces the number of scans necessary to generate the pattern and thus reduces the time required for generating the pattern.

In an embodiment of the system, the system comprises a power-control means for controlling a power per illuminated area per time for preventing damaging the light emitting diode device, the power-control means being configured for scanning the condensed light beam in a line-by-line scanning mode in a uni-directional scanning direction or bi-directional scanning direction at substantially constant scanning speed across a scan-area while modulating the power of the radiation means and/or further radiation means for controlling the power per illuminated area per time for generating the pattern, the scan-area being an area of the light emitting diode device which is scanned for generating the pattern. Using a line-by-line scanning mode at substantially constant scanning speed while controlling the power emitted by the radiation means and/or further radiation means, the power per illuminated area per unit time is relatively well controlled and thus local excessive heating and thus local damage of the light emitting diode device may be prevented. The modulation of the power of the radiation means and/or further radiation means not only includes on/off control of the radiation means and/or further radiation means, but also includes the modulation of a relatively high output power and a relatively low output power, where, for example, the relatively high output power generates deformations and the relatively low output power does not generate deformations but enables a relatively uniform increasing of the temperature of the light emitting diode device.

In an alternative embodiment of the system, the power-control means is configured for reversing a scan-direction outside the scan-area in the line-by-line scanning mode for ensuring the scan-speed at the scan-area is equal to the required scan-speed. When changing scan direction generally the initial scan-speed deviates from the required scan-speed. By reversing the scan-direction outside the scan-area the power-control means is allowed to control the scan-speed to be substantially equal to the required scan-speed inside the scan-area, thus again more accurately control the power per illuminated area per time.

In an alternative embodiment of the system, the power-control means is configured for skipping a predefined number of scan-lines in the line-by-line scanning mode between a previous scan-line and the current scan-line. Temporarily skipping a predefined number of scan-lines ensures that the scanning of the next scan-line adjacent to the previous scan-line obtains excessive power at the edges of the scan-line due to residual heat which still was present at the edge of the current scan-line due to the previous scan-line. Excessive power may cause damage to a layer of the light emitting diode device which should be prevented. As such, by skipping a predefined number of scan-lines, the previous scan-line is allowed to cool sufficiently that when applying the adjacent scan-line at a later time, there is not excessive power at the edges and damage is prevented.

In an alternative embodiment of the system, the power-control means is configured for applying a scan-delay before initializing a next scan across the scan-area for controlling the power per illuminated area per time for generating the pattern. Again applying the scan-delay allows edges of the previous scan-line to cool down before the next scan-line is applied, thus preventing excessive heating and thus preventing locally damaging the light emitting diode device.

The fourth aspect of the invention comprises a method of calibrating the system, wherein the method of calibrating comprises the steps of:
  setting initial parameters of the condensed light beam of the system for generating the patterned light emitting diode device,
  locally irradiating the organic light emitting diode device with the condensed light beam generating a test-pattern comprising a plurality of different deformations in the light-reflective layer (32),
  determining from the test-pattern an intensity and/or a scanning speed of the condensed light beam for generating the pattern.

Preferably the light-reflective layer is the anode or cathode layer. To ensure that such light-reflective layer maintains its conductivity in a direction parallel to the light-reflective layer, the light-reflective layer preferably is not damaged during patterning. Furthermore, to ensure that the remainder of the light emitting diode device emits light during operation of the light emitting diode device, also the remainder of the layers constituting the light emitting diode device should not be damaged. As such, calibrating the system before and even maybe during patterning may prevent the condensed light beam to damage any of the layers constituting the light emitting diode device and as such ensures the proper functioning of the light emitting diode device, also after the pattern has been applied. Furthermore, the exact damaging threshold may alter for different batches of light emitting diode devices and may alter due to small production variations during the production process. The damaging threshold defines a threshold above which the light emitting diode device is damaged. Furthermore due to production variations the deformation contrast may be different for a predefined power per illuminated area per time for different light emitting diode devices. As such, it is typically required to calibrate the system before patterning any light emitting diode device. The step of locally irradiating the light emitting diode device for generating the test-pattern may be done while the light emitting diode device is in an off-state or while the light emitting diode device is switched on.

In an embodiment of the method of calibrating, the method further comprises the step of: adapting the focus position of the condensed light beam and/or further condensed light beam.

The condensed light beam and/or further condensed light beam may be a substantially parallel beam having sufficient intensity to generate deformations in the light-reflective layer. In such an arrangement a focus may not be required for generating the pattern and the smallest dimensions may be determined by the width of the substantially parallel beam of light. Alternatively, when a focused beam of light is used or required for generating the deformations, the exact location of the focus may need to be adapted to ensure that the intensity of the condensed light beam with which the deformations are produced does not exceed the damage threshold. Furthermore, a correct focus position is required to locally reach sufficient intensity to achieve the required contrast.

In an embodiment of the method of calibrating, the method of calibrating is performed at an unused edge of the organic light emitting diode device before generating the pattern.

In an embodiment of the method of calibrating, a dimension of the test-pattern is configured for being substantially invisible to a naked human eye. In such a preferred embodiment the test-pattern not necessarily need to be applied at the edge of the light emitting diode device, but may also be applied in the center of the light emitting diode device or at several locations on the light emitting diode device. Applying the test-pattern in the center of the light emitting diode device would further improve the accuracy of the method of calibrating as this would calibrate the system at the location where the pattern would be generated. This would also enable correction for variations across the light emitting diode device as it enables the applying of a plurality of test-patterns across the light emitting diode device. This enables a relatively accurate generation of different grey-levels and would prevent damage across the whole light emitting diode device.

To be able to work with such small test-patterns, the feed-back system connected to the system for producing the pattern must be able to work with such small test patterns. For example, a camera having a relatively strong magnification would be required to be able to determine the predetermined contrast from a test pattern which is substantially not visible with the human naked eye.

BRIEF DESCRIPTION OF THE DRAWINGS

These and other aspects of the invention are apparent from and will be elucidated with reference to the embodiments described hereinafter.

In the drawings.

The Figures are purely diagrammatic and not drawn to scale. Particularly for clarity, some dimensions are exaggerated strongly. Similar components in the Figures are denoted by the same reference numerals as much as possible.

DETAILED DESCRIPTION OF EMBODIMENTS

Figure 1A:
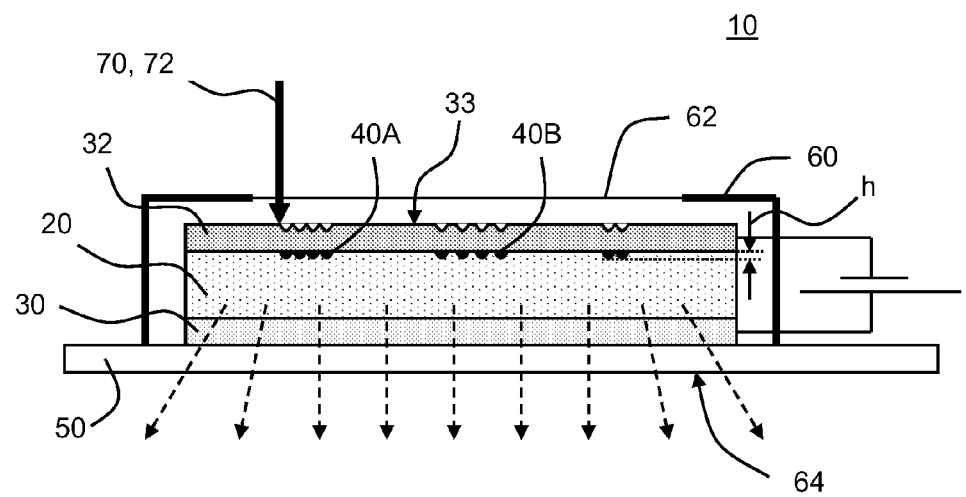
FIGS. 1A and 1B shows a schematic cross-sectional view of a light emitting diode device according to the invention.
Figure 1B:
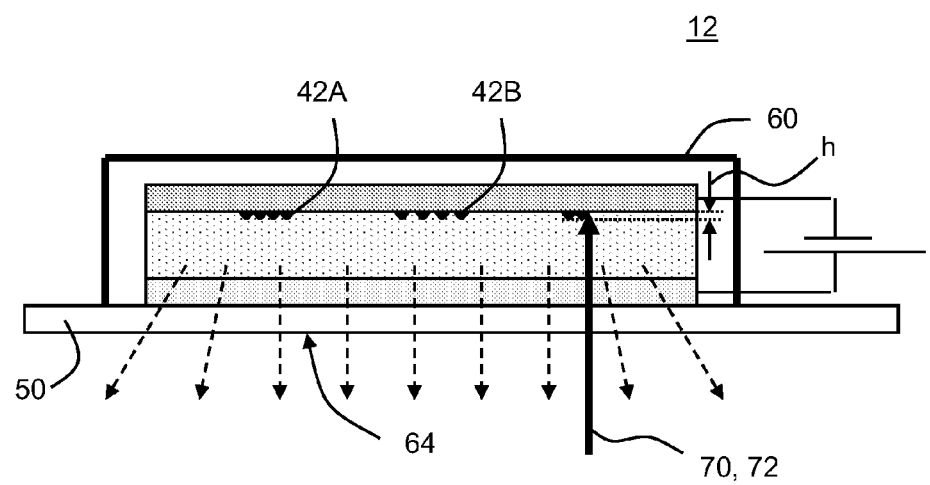

FIGS. 1A and 1B show a schematic cross-sectional view of a light emitting diode device 10, 12 according to the invention. The light emitting diode device 10, 12 generally comprises a plurality of layers 30, 20, 32 and comprises a layer comprising light emitting material 20 and comprises an anode layer 32 and a cathode layer 30. The schematic cross-sectional view of the light emitting diode 10, 12 as shown in FIGS. 1A and 1B only show these three layers although the typical light emitting diode devices 10, 12 comprise several more layers. For example, when the light emitting diode device 10, 12 is an organic light emitting diode device 10, 12 the light emitting layer 20 comprises, for example, organic light emitting material 20 and a plurality of current support layers (not shown) which are used to enable and/or assist and/or dimension the current flowing, in operation, through the light emitting material 20 to cause the light emitting material 20 to emit light. The organic light emitting material 20 is configured to emit light when a current runs through the organic light emitting material 20. Typically, the emission of light is based on the local recombination of electrons being a negatively charged particle (not shown) with holes being a representation of an imaginary positively charged particle (not shown). The recombination of such electron-hole pair at the organic light emitting material 20 results in an excitation which can decay with the emission of light of a predefined color. The light emitting diode device 10, 12 may comprise a single layer of light emitting material 20 which is arranged for emitting a predefined color of light when an electron-hole pair recombines. Alternatively, the light emitting diode device 10, 12 may comprise a plurality of layers of light emitting material 20 (not shown) each emitting, for example, a different color, or the light emitting layer 20 may comprise a mix of light emitting materials which emit different colors and which together emit, for example, white light of a predefined color temperature. As such, the color of the light emitted by the light emitting diode device 10, 12 may be determined by choosing a plurality of layers and/or by choosing a specific mixture of light emitting materials in the light emitting layer 20. The light emitting diode device 10, 12 further comprises the anode layer 30 and the cathode layer 32 between which the light emitting material 20 is sandwiched. The anode layer 30 may, for example, comprise of ITO being a metal being transparent for a specific range of light, allowing the light generated in the light emitting material 20 to be emitted from the organic light emitting diode device 10, 12 via the light-emission window 64. The cathode layer 32 may, for example, comprise a 2 nanometers Barium layer and a 100 nanometers Aluminum layer which has good conductive characteristics and which may be well applied in semiconductor manufacturing processes. In the embodiment of the light emitting diode device 10, 12 as shown in FIGS. 1A and 1B, the Aluminum layer constituted a light-reflective layer 32 which reflects light generated in the light-emitting layer 20 towards the light-emission window 64. Of course, the anode layer 30 and cathode layer 32 may be exchanged such that the light may be emitted from the light emitting diode device 10, 12 via the cathode layer 32. The ITO-layer is often applied on a substrate 50 for supporting the light emitting diode device 10, 12 and which is also substantially transparent to the light emitted by the light emitting diode device 10, 12.

The light emitting diode device 10, 12 as shown in FIGS. 1A and 1B comprise a pattern 45 (see FIG. 2A), which is permanently visible both in the on-state of the light emitting diode device 10, 12 and in the off-state of the light emitting diode device 10, 12. The pattern is constituted of deformations 40A, 42A, 40B, 42B of the Aluminum layer 32 being the light-reflective layer 32.

The light emitting diode device 10, 12 typically is sealed in an encapsulation 60 to protect the light emitting diode device 10, 12 from environmental influences. An part 62 of the encapsulation 60 which may be configured to be substantially transparent to a condensed light beam 70, 72, indicated with the solid arrow. This condensed light beam 70, 72 may be used to generate the deformations 40A, 42A, 40B, 42B in the light-reflective layer 32.

During the off-state of the light emitting diode device 10, 12 ambient light (not shown) enters the light emitting diode device 10, 12 via the light-emission window 64. As the anode layer 30 and the light emitting layer 20 are both at least partially transparent, part of the ambient light will be transmitted by the anode layer 30 and the light emitting layer 20 and impinge on the light-reflective cathode layer 32 which reflects this light back to the light-emission window 64. The part of the ambient light which impinges on the deformations 40A, 40B, 42A, 42B will be scattered, and thus the pattern constituted of the deformations 40A, 40B, 42A, 42B on the light-reflective layer 32 will be clearly visible via the light-emission window 64.

During the on-state of the light-emitting diode device 10, 12 a current runs through the light emitting layer 20 and the light emitting layer 20 emits light. This light is emitted substantially in all directions. In the embodiment of the light emitting diode device 10, 12 as shown in FIGS. 1A and 1B, the light which is generated in the light emitting layer 20 and which progresses towards the at least partially transparent anode layer 30 is at least partially transmitted through the anode layer 30 and through the substrate 50 and subsequently emitted via the light-emission window 64. The light which progresses towards the light-reflective cathode layer 32 is reflected by the cathode layer 32 towards the light-emission window 64 and subsequently emitted via the light-emission window 64 (indicated in FIGS. 1A and 1B by dashed arrows). Again, light impinging on the local deformations 40A, 40B, 42A, 42B in the light-reflective layer 32 will be scattered by these deformations which is clearly visible through the light-emission window 64. So during the on-state of the light emitting diode device 10, 12 both part of the ambient light is scattered by the deformations 40A, 40B, 42A, 42B and part of the light generated in the light emitting material 20 is scattered by the deformations 40A, 40B, 42A, 42B and thus the pattern 45 constituted of the deformations 40A, 40B, 42A, 42B again is clearly visible through the light-emission window 64.

From the above elucidation, it is clear that a pattern 45 generated in the light-reflective layer 32 of the light emitting diode device 10, 12 is clearly visible both during the on-state and during the off-state of the light emitting diode device 10,12. The deformations 40A, 40B, 42A, 42B may be produced using a condensed light beam 70, 72 as is indicated with a solid arrow 70, 72 in both FIGS. 1A and 1B. The height h of the deformations depends on the power of the condensed light beam 70, 72 and on a thickness of the light-reflective layer 32. The height h contributes to determine the level of scattering of light from the deformations 40A, 42A, 40B, 42B and thus determines the visual effect obtained by the deformations 40A, 42A, 40B, 42B.

In the embodiment of the light emitting diode device 10, 12 as shown in FIGS. 1A and 1B, the light-reflective layer 32 is the cathode layer 32. The deformations 40A, 42A, 40B, 42B are preferably generated in the cathode layer 32 while substantially maintaining the conductivity of the cathode layer 32. This has the major benefit that patterns 45 in which, for example, a non-patterned part must be present surrounded by a patterned part, the conductivity of the cathode layer 32 at the surrounded non-patterned part is still sufficient to allow the light emitting diode device 10, 12 to still emit light at the non-patterned part surrounded by patterned area. In some known methods of patterning, one of the electrode layers is cut through due to the patterning, blocking the current flowing to isolated non-patterned areas causing the light emitting diode device to not emit light at this isolated non-patterned area. For example, patterning the letter "O" would cause the center of the letter "O" not to emit light when the pattern is created by cutting through the electrode, while the center of the letter "O" would still emit light when the pattern would be created using the deformations 40A, 42A, 40B, 42B in which the conductivity of the cathode layer 32 is substantially maintained.

So, preferably the deformations 40A, 42A, 40B, 42B in the light-reflective layer 32 being the anode-layer 30 or cathode-layer 32 is done without damaging any of the layers of the light emitting diode device 10, 12 which are used for the light emission. As the deformations are generated in the light-reflective layer 32 such that substantially the conductivity of the light-reflective layer 32 is maintained, the whole light emitting surface of the light emitting diode device 10, 12 will radiate light while the pattern 45 remains visible.

Substantially maintaining the conductivity of the light-reflective layer 32 indicates that the overall conductivity across the light-reflective layer 32 is maintained while, for example, minute holes and/or cracks (not shown) may appear. Although, as indicated before, in a preferred embodiment of the patterned light emitting diode device 10, 12, no holes and/or cracks are present in the light-reflective layer 32 as they would typically reduce the reflectivity of the light-reflective layer 32 at the location of the holes and/or cracks, the patterned light emitting diode device 10, 12 still operates with these minute holes and/or cracks present. The quality of the pattern 45 may be reduced due to these minute holes and/or cracks reducing the attractive metallic appearance of the pattern 45. Minute holes and/or cracks preferably have dimensions which are not visible by the naked human eye and/or may have dimensions, for example, smaller than 100 μm, and more preferably smaller than 10 μm.

The pattern 45 may comprise a plurality of grey-levels 40A, 40B; 42A, 42B. These grey-levels 40A, 40B; 42A, 42B may, for example, be generated by a density of the deformations 40A, 40B, 42A, 42B. In the embodiments of the light emitting diode device 10, 12 as shown in FIGS. 1A and 1B, deformations 40A, 42A arranged at a higher density represent darker areas of the pattern 45, while deformations 40B, 42B arranged at a lower density represent lighter areas of the pattern 45. The deformations 40A, 40B, 42A, 42B may be arranged in lines in which the spacing between the lines of deformations 40A, 40B, 42A, 42B determine the grey-level, or may be arranged in dots in which the spacing between the dots of deformations 40A, 40B, 42A, 42B determine the grey-level. Such an arrangement enables to generate a pattern comprising detailed images comprising a plurality of grey-levels on the light emitting diode device 10, 12.

In the embodiment of the light emitting diode device 10 as shown in FIG. 1A, the encapsulation 60 comprises a part 62 through which the condensed light beam 70, 72 may impinge on a rear-wall 33 of the light-reflective layer 32 to generate the deformations 40A, 40B. The rear-wall 33 of the light-reflective layer 32 is a side of the light-reflective layer 32 facing away from the light-emission window 64. A benefit of this arrangement is that the condensed light beam 70, 72 does not need to be transmitted by the substrate 50, the anode layer 30 and the light emitting material 20 before impinging on the light-reflective layer 32 to generate the deformations. This would reduce a possibility that the condensed light beam 70, 72 would damage any of the layers of the light emitting diode device 10 rather than generate the deformations 40A, 40B. Furthermore, the rear-wall 33 of the light-reflective layer 32 does not need to be reflective. If the rear-wall 33 of the light-reflective layer 32 would not be reflective, the rear-wall 33 would more easily absorb the light from the condensed light beam 70, 72 to generate the deformations 40A, 40B and thus a less powerful condensed light beam 70, 72 is required for generating the deformations 40A, 40B. A drawback of this embodiment is that the pattern 45 must be created in a mirror-image and that the encapsulation 60 requires the additional part 62 for allowing the condensed light beam 70, 72 to be transmitted through the encapsulation 60 to create the pattern 45.

In the embodiment of the light emitting diode device 12 as shown in FIG. 1B, the encapsulation 60 fully seals the light emitting diode device 12 and does not allow the condensed light beam 70, 72 to impinge on the rear-wall 33. As such, the condensed light beam 70, 72 impinges on the light-reflective layer 32 via the substrate 50, the at least partially transparent anode layer 30 and the light emitting material 20 to generate the deformations 42A, 42B.

Figure 2A:
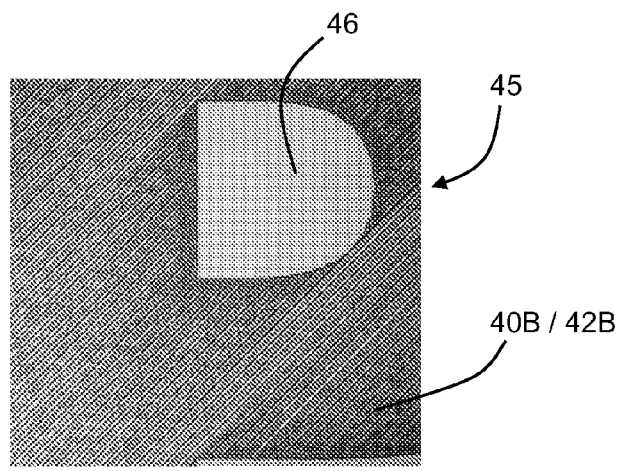
FIGS. 2A to 2D shows an illustration of different patterns generated on a light-reflective layer of an organic light emitting diode device according to the invention.
Figure 2B:
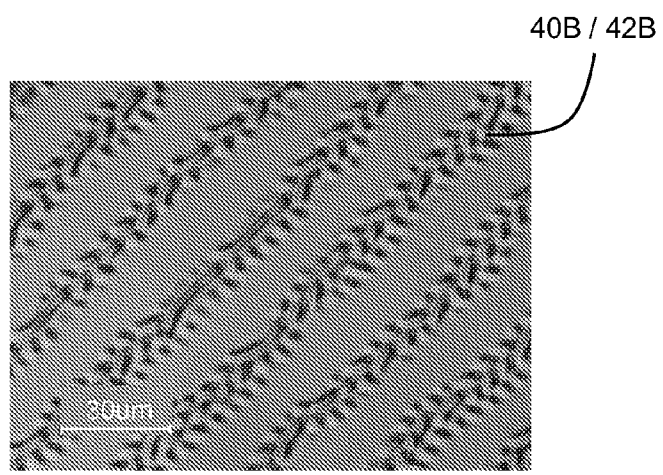

FIGS. 2A to 2D shows an illustration of different patterns 45 generated on a light-reflective layer 32 of an organic light emitting diode device 10, 12 according to the invention. In FIG. 2A a detailed part of a letter "P" is shown. The deformations 40B, 42B are generated in lines arranged diagonally. The lines of deformations constituting the pattern 45 of FIG. 2A are shown in more detail in FIG. 2B. Choosing a right power of the condensed light beam 70, 72 would generate deformations 40B, 42B without generating holes and/or cracks as is illustrated in FIG. 2B. Such deformations in the pattern 45 as shown in FIG. 2A would cause the letter "P" to be clearly visible both during the on-state and during the off-state of the light emitting diode device 10, 12 while also the center-part 46 of the letter "P" being the unpatterned part 46 will illuminate light during the on-state.

Figure 2C:
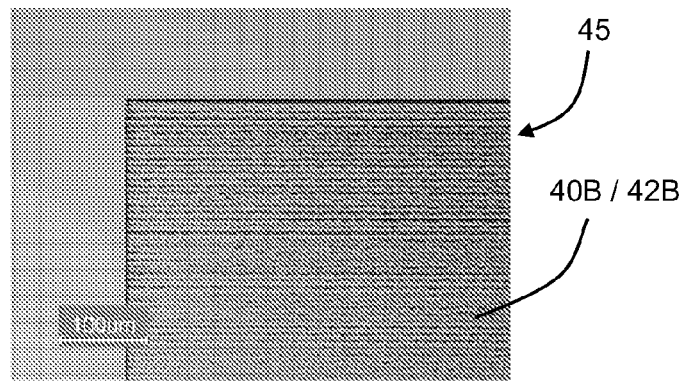
Figure 2D:
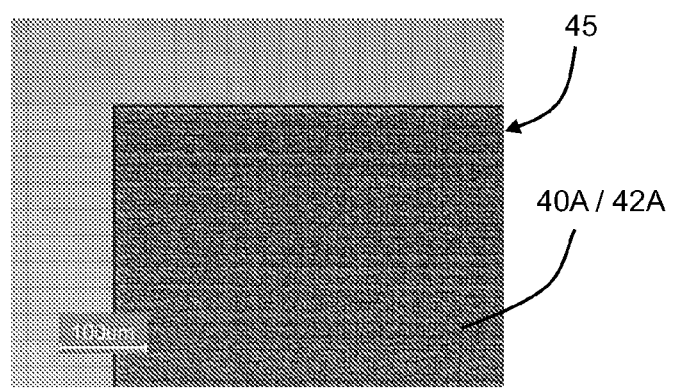

FIGS. 2C and 2D show a part of a different pattern 45 in which the density of the lines of deformations 40A, 40B, 42A, 42B has been altered. In FIG. 2C the distance between the lines of deformations 40B, 42B is larger compared to the distance between the lines of deformations 40A, 42A as shown in FIG. 2D. As such, the part of the pattern 45 as shown in FIG. 2D is interpreted as a darker grey-level compared to the part of the pattern 45 as shown in FIG. 2C, again illustrating the ability to generate different grey-levels via varying the density of the deformations 40A, 40B, 42A, 42B.

Figure 3A:
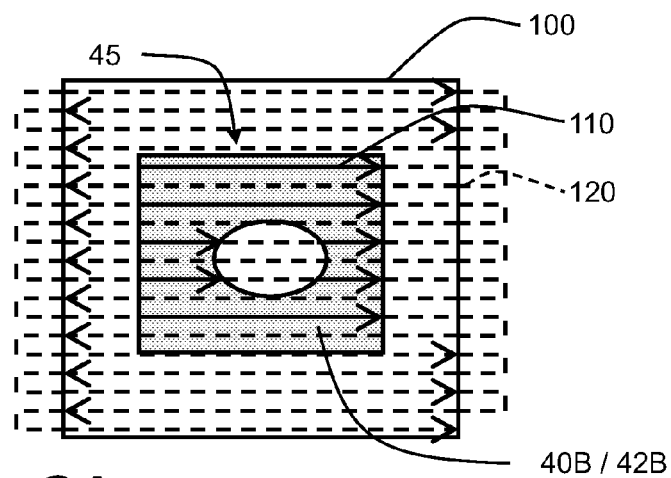
FIGS. 3A to 3C show different patterning strategies for patterning the light-reflective layer according to the invention.
Figure 3B:
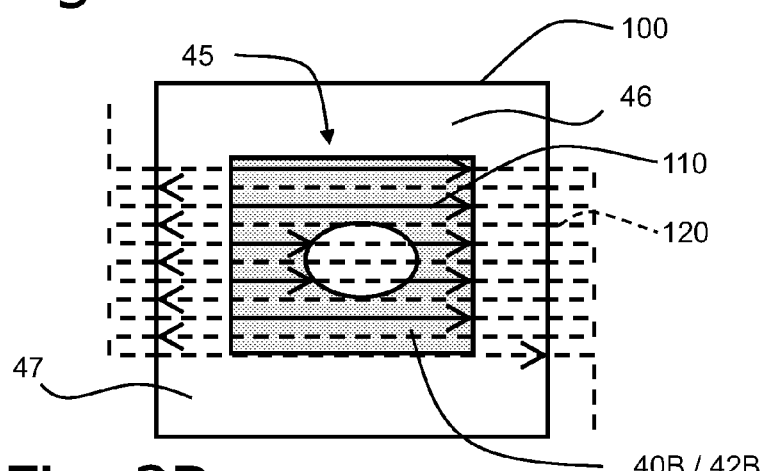
Figure 3C:
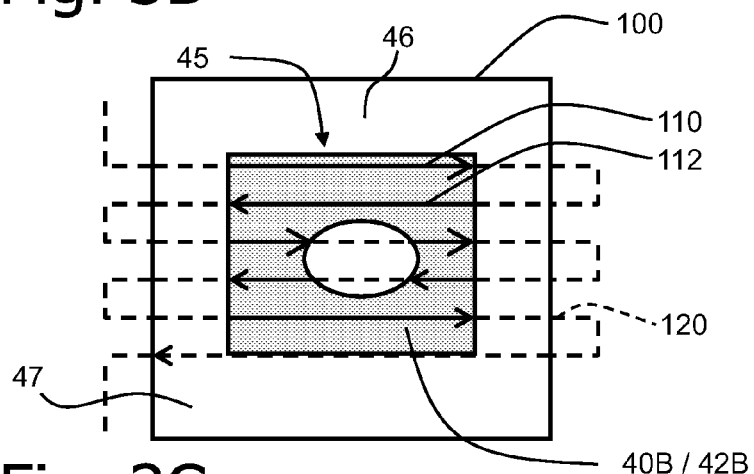

FIGS. 3A to 3C show different patterning strategies for patterning the light-reflective layer 32 according to the invention. FIGS. 3A to 3C show a scan-area 100 being an area of the light emitting diode device 10, 12 which is scanned for generating the pattern 45. The patterning strategies shown in FIGS. 3A to 3C are a line-by-line patterning of the scan-area 100. Solid lines 110 indicate the generation of the pattern 45 by generating deformations 40A, 40B, 42A, 42B in the light-reflecting layer 32 of the light emitting diode device 10, 12. This line-by-line scanning of the condensed light beams 70, 72 may generate lines of deformations 40A, 40B, 42A, 42B when the condensed light beam 70, 72 is, for example, a continuous laser beam 70, 72. Alternatively, the line-by-line scanning as shown in FIGS. 3A to 3C may result in dots of deformations 40A, 40B, 42A, 42B when, for example, the condensed light beam 70, 72 is switched on and off periodically or when, for example, the condensed light beam 70, 72 is a pulsed laser beam 70, 72. The dashed lines 120 in FIGS. 3A to 3C indicated a scanning across the scan-area 100 without the condensed light beam 70, 72 switched on for generating the deformations 40A, 40B, 42A, 42B.

In FIG. 3A the scan-area 100 is fully scanned for generating the pattern 45. The scan-direction is reversed outside the scan-area 100 to ensure that the scanning-speed at the scan-area 100 is substantially equal to a required scan-speed.

To save time, the scanning as FIG. 3B skips non-image-areas 46, 47 of which it is clear that there is no patterning, thus no generation of deformations 40A, 40B, 42A, 42B necessary. As such, less lines 110, 120 have to be scanned, thus allowing to pattern the image 45 using less time.

In FIG. 3C the generation of deformations 40A, 40B, 42A, 42B is done when scanning in both directions. In the previous examples, the scanning represented an uni-directional scanning, meaning that the deformations 40A, 40B, 42A, 42B are only generated when the condensed light beam 70, 72 is scanning in a predefined direction, in the FIGS. 3A and 3B this predefined direction was from left to right. The movement from right to left is only used for repositioning the condensed light beam 70, 72 to the start of the next scan. A benefit of such scan-method is that the light emitting diode device 10, 12 may cool down during the return-scan such that no overheating of certain locations of the pattern 45 may occur, damaging the light-reflective layer 32 or any other layer. A drawback is that it takes additional time to generate the pattern 45. In the scanning as shown in FIG. 3C the generation of the pattern 45 is done when scanning in both directions, so called bi-directional scanning. This bi-directional scanning saves time, and thus allows the pattern to be generated more quickly. However, this bi-directional scanning may require a scan-delay when reversing scan-direction to prevent the light-reflective layer 32 or any other layer of the light emitting diode device 10, 12 to overheat and thus be damaged by the condensed light beam 70. 72.

Varying the power of the condensed light beam 70, 72, the scanning speed of the condensed light beam 70, 72 across the scan-area 100 and by varying the focus of the condensed light beam 70, 72 the exact power which is applied to the illuminated area per time may be determined. The preferred scanning speed, power and focus may be found via calibration of the patterning system (see FIGS. 4A to 4C)

Figure 4A:
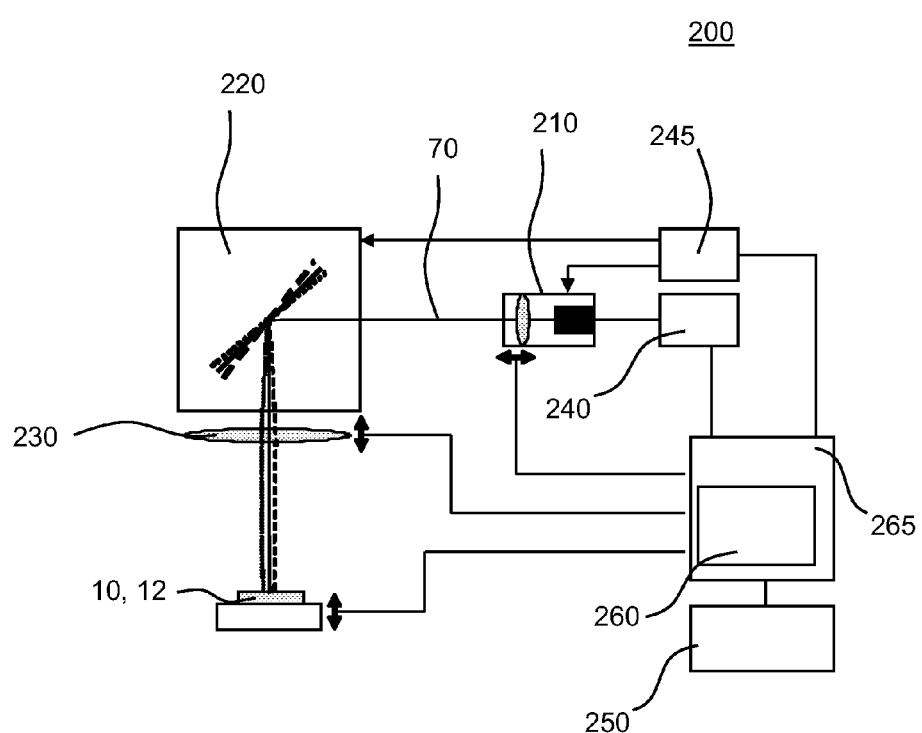
FIGS. 4A to 4C show schematic representations of different embodiments of a system for generating a patterned light emitting diode device.
Figure 4B:
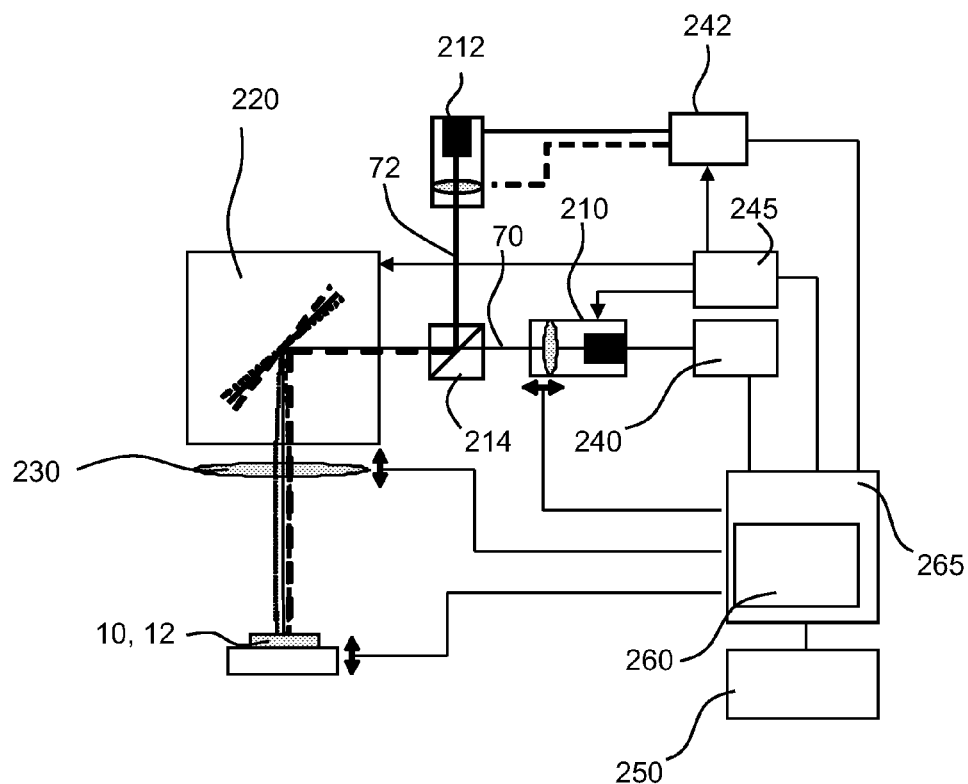
Figure 4C:
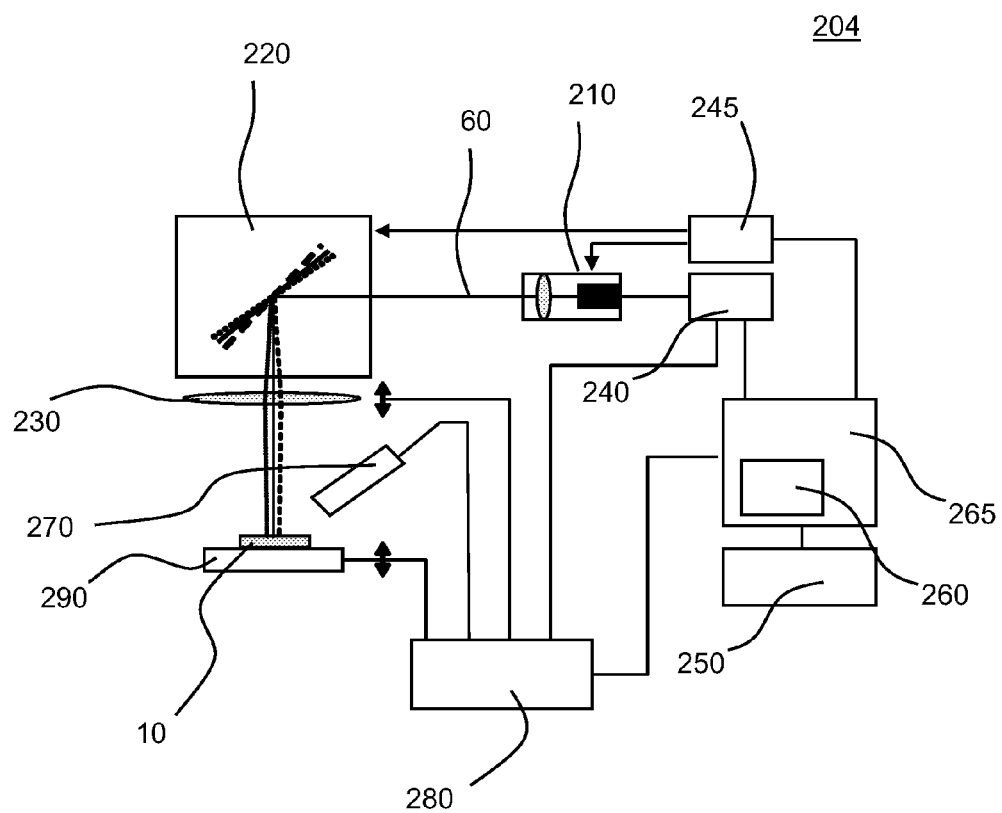

FIGS. 4A to 4C show schematic representations of different embodiments of a system 200, 202, 204 for generating a patterned light emitting diode device 10, 12 according to the invention. The system 200, 202, 204 comprises irradiation means 210, 212, for example, a light source 210, 212 for generating condensed light 70, 72, and comprise a scanning means 220, for example, a moving mirror 220 movable in three dimensions. The system 200, 202, 204 may also comprise focusing means 230, for example, an f-θ-lens 230 which is movable in a direction parallel to the condensed light beam 70, 72 for altering the location of the focus of the condensed light beam 70, 72. The system 200, 202, 204 further comprises a driver 240, 242 for the light source 210, 212, for example, for controlling an intensity and/or color of the condensed light beam 70, 72 emitted by the light source 210, 212. The system also comprises a control means 245 for controlling the scanning means 220 to control the moving of the condensed light beam 70, 72, both in position and speed across the light emitting diode device 10, 12. The control means 245 also controls the irradiation means 210, 212, for example, an intensity, pulse-frequency and beam-dimensions. The system 200, 202, 204 further comprises a processor 265 driving the control means 245 and the driver 240, 245. The processor 265 may also comprise conversion means 260 for converting an input-pattern, being, for example, a digital representation of the pattern 45 to be produced on the light emitting diode device 10, 12 into a movement of the condensed light beam 70, 72 and/or into an intensity variation and/or speed variation of the condensed light beam 70, 72 and/or a color variation of the condensed light beam 70, 72. The system 200, 202, 204 may further comprise input means 250 for providing the input-pattern to the processor 265. The input-pattern may be in a specific format or a generic format in which the input-pattern is provided, for example, by a user to the system 200, 202, 204. The input means 250 may also be connected to a network environment (not shown), for example, the internet. A customer may then simply upload the input-pattern to the processor 265 via a server (not shown).

The control means 245 may, for example, be a scan-control means 245 for controlling a patterning speed of the system 200, 202, 204. This scan-control means 245 for example, dynamically controls a spot-size of the condensed light beam 70, 72 while generating the pattern 45. The scan-control means 245 is, for example, configured for adapting the output power of the condensed light beam 70, 72 to ensure that a power per illuminated area remains substantially constant. The preferred spot-size of the condensed light beam 70, 72, for example, depends on the minimum feature size which must be patterned at the part of the pattern 45. The spot-size may, for example, be altered to be relatively small near edges of a pattern 45 to obtain accurate placement of the edge of the pattern 45. Alternatively, the spot-size for the remainder of the pattern 45 may, for example, be larger to speed up the patterning process. Still, the power deposited via the condensed light beam 70, 72 should not exceed a damage-threshold and should preferably remain substantially constant even when the spot-size is altered. This may be achieved by moving the condensed light beam 70, 72 having higher power density at a larger speed across the scan-area 100 (see FIG. 3). As such, the substantially same pattern 45 will be generate using less patterning time.

The system 202 may also comprising a further radiation means 212 which generates the further condensed light beam 72 and which is controlled by the scan-control means 245. The further condensed light beam 72 preferably has a different spot-size compared to condensed light beam 70 of the radiation means 210. The scan-control means 245, for example, dynamically selects the radiation means 210 and/or the further radiation means 212 while generating the pattern 45. Both the radiation means 210 and the further radiation means 212 may be calibrated such that the characteristics such as spot-size and power per illuminated are of both the condensed light beam 70 and the further condensed light beam 72 are well known. The scan-control means 245 is thus able to quickly switch from the radiation means 210 to the further radiation means 212 if required, typically much quicker than when the system 200, 202, 204 comprises a single radiation means 210 of which the spot-size and power must be adapted depending on the level of detail which must be patterned. For example, the edges of a pattern may be generated using the radiation means 210, 212 having the smaller spot-size, while the center of the pattern may be generated using the radiation means 210, 212 having the larger spot-size having substantially the same photon-dose per unit area. As such, again the scanning speed can be improved.

The control means 245 may also be a power-control means 245 for controlling a power per illuminated area per time for preventing damaging the light emitting diode device 10, 12. This power-control means 245 may, for example, control the radiation means 210, 212 and the scanning means 220 to apply the different scanning strategies which have earlier been discussed together with FIGS. 3A to 3C.

FIG. 4A shows the schematic representation of the system 200 according to the invention. FIG. 4B shows the schematic representation of the system 202 according to the invention comprising the further radiation means 212. The system 202 as shown in FIG. 4B further comprises combination optics 214 for combining the condensed light beam 70 and the further condensed light beam 72.

FIG. 4C shows the schematic representation of the system 204 comprising calibration means 270, 280. Next to the irradiation means 210 with driver 240, the scanning means 220 with driver 245, the focusing means 230, the processor 265 comprising conversion means 260, and the input means 250, the system 300 as shown in FIG. 4 further comprises calibration means 270, 280 for calibrating the system 204 to generate the required pattern 45 while substantially preventing to damage any of the remaining layers of the light emitting diode device 10, 12. The calibration means 270, 280 may, for example, be used for determining a spot-size of the condensed light beam 70 and/or for determining a spot-size of the deformations 40A, 40B, 42A, 42B in the resulting pattern 45. The determination of the spot-size of either the condensed light beam 70 and/or of the deformations 40A, 40B, 42A, 42B in the resulting pattern 45 may be done using a feedback system 270, 280, for example, comprising a camera 270 which provides the feedback to a user. Alternatively, the feedback camera 270 may be connected to image processing module 280 comprising image processing software via which the spot-size may be determined automatically. For determining the spot-size in the resulting pattern 45, a test-pattern (not shown) may be applied which is measured after having been patterned. The measured dimensions of the deformations 40A, 40B, 42A, 42B in the test-pattern may be used to determine the right conditions of the condensed light beam 70 to be able to generate the required pattern 45. The magnification of such a feedback camera 270 is preferably relatively high to enable the test-pattern to be relatively small as the test-pattern is preferably not visible to a user because the test-pattern may be too small to see. Alternatively the test-pattern may be generated at an edge of the light emitting diode device 10, 12. Using a small substantially invisible test-pattern enables the generation of the test-pattern at different locations across the light emitting diode device 10, 12 and as such, the local conditions across the light emitting diode device 10, 12 for generating the required pattern 45 may be measured and the calibration of the light emitting diode device 10, 12 may be done across the surface of the light emitting diode device 10, 12. This would also ensure local production variations in the light emitting diode device 10, 12 to be considered during the calibration, further improving the quality of the pattern 45 generated on the patterned light emitting diode device 10, 12.

The system 204 as shown in FIG. 4C further comprises a stage 290 for moving the light emitting diode device 10, 12 in a direction substantially parallel to the impinging condensed light beam 70. In the system 204 as shown in FIG. 4C, the image processing unit 280 is connected to the focusing means 230 and to the stage 290 for controlling the position of the focusing means 230 and of the stage 290 in response to the image captured by the camera 270 and processed by the image processing unit 280. In this respect the image processing unit 280 as disclosed here typically comprises a processor (not shown) which may, for example, comprise the image processing software stored on the processor. This processor may also use the result from the image processing to control and/or drive the stage 290 and the focusing means 230. However, this may also be embedded in the already present processor 265 for generating the patterned light emitting diode device 10, 12.

Figure 5:
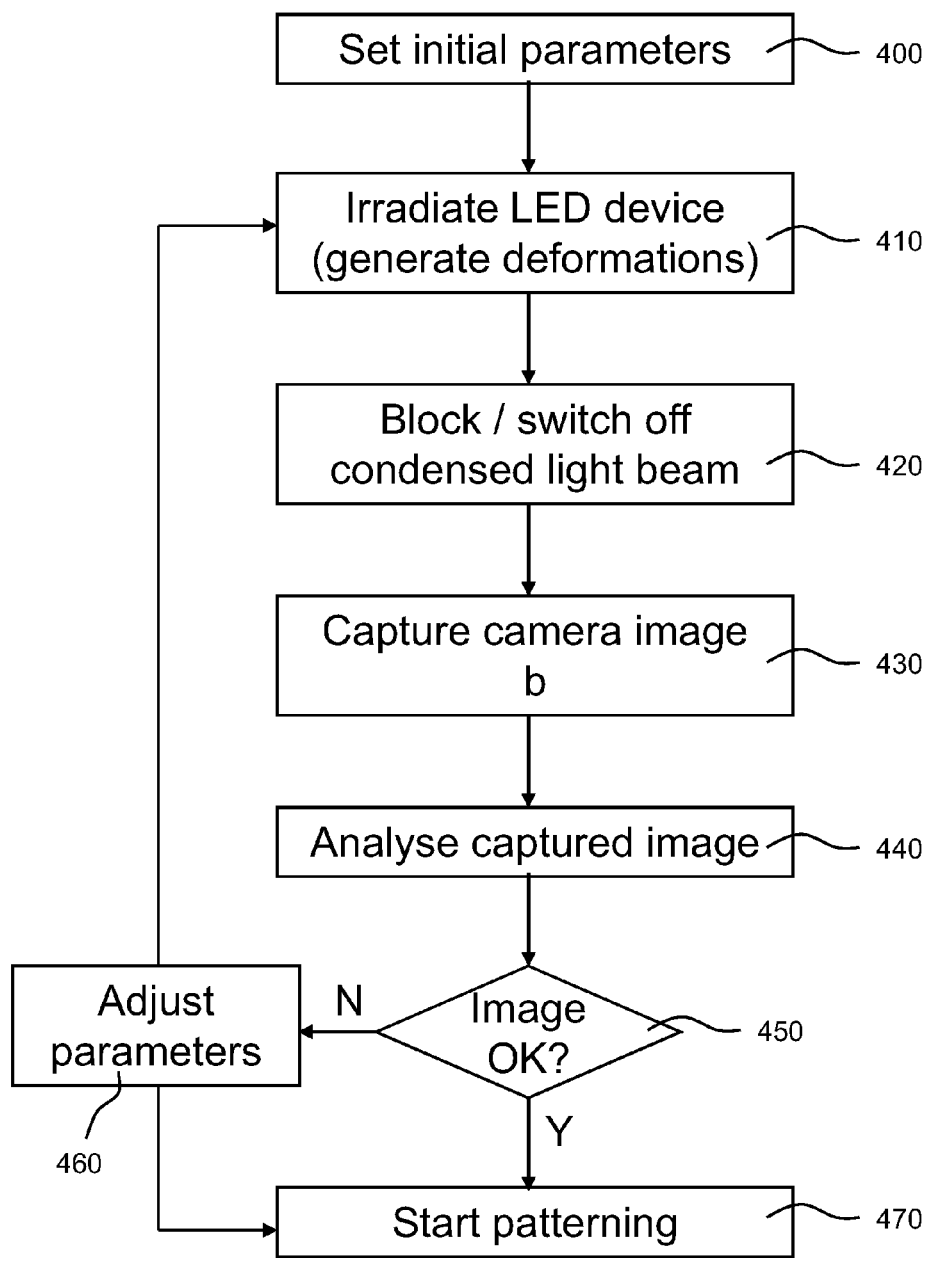
FIG. 5 shows a flow-diagram illustrating a calibration method of the system for generating the patterned light emitting diode device according to the invention.

FIG. 5 shows a flow-diagram illustrating a calibration method of the system 200, 202, 204 for generating the patterned light emitting diode device 10, 12 according to the invention. The flow-diagram of FIG. 5 comprises a step of "set initial parameters" 400 in which the parameters of the condensed light beam 70 and/or further condensed light beam 72 are set, together with the scanning speed and a typical stage 290 position and focus position of the focus means 230. Such initial parameters may, for example, depend on initial characteristics of the light emitting diode device 10, 12 which is placed on the stage 290. For different types of light emitting diode devices 10, 12, different initial parameter settings may be known and by selecting a specific light emitting diode device 10, 12 which is to be patterned, the corresponding initial parameters may be chosen such that they substantially correspond to the selected specific light emitting diode device 10, 12. Preferably, the initial parameters are substantially below any light-induced damaging thresholds. The information of the specific light emitting diode device 10, 12 may be received via the user, operator, or may be obtained automatically from identification tags on the light emitting diode device 10, 12, such as via bar-codes or RFID chips which comprise information about the specific light emitting diode device 10, 12 and which may be read or otherwise communicated to the processor 265 (see FIG. 4).

A next step in the flow-diagram comprises "irradiate LED device" 410 during which, for example, at least part of a test pattern is applied to an edge of the light emitting diode device 10, 12 or to any other location of the light emitting diode device 10, 12 when the test pattern is so small that it is substantially not visible with the naked human eye. The test-pattern comprises deformations which are applied to the light-reflective layer 32, for example, deformations having an range of different densities and/or sizes to determine the parameters necessary to obtain a specific grey-level and/or to obtain a specific minimum feature dimension.

After the generation of the test pattern the step "block/switch off condensed light beam 70" 420 is used to interrupt the light beam 70 to enable the camera to inspect the generated test-pattern. Interruption of the light beam 70 may be obtained by simply blocking the radiation means 210 which may be especially beneficial when using a laser light source 210 as it improves the stability of the output light from the laser light source 210 when it remains switched on and the interruption of the condensed light beam 70 is done by blocking the condensed light beam 70 rather than by switching off the radiation means 210. Alternatively, the interruption of the condensed light beam 70 may be done by switching off the light source 210.

Subsequently, the camera 270 captures an image of the generated test-pattern in the step "capture camera image" 430, and the captured image is analyzed in the step "Analyze captured image" 440. This step may be done via an operator or automatically via image processing software in the image processing module 280. From the captured image the image processing module 280 determines whether the deformations 40A, 40B, 42A, 42B have the required dimensions and whether there may be some damage to the light emitting diode device 10, 12 due to the condensed light beam 70.

At this point the step of "image OK?" 450 is used to check whether the analyzed image indicates that the currently set parameters are right for generating the pattern 45. If the parameters are right, patterning may commence in a next step of "Start patterning" 470. Alternatively, the parameters may be adjusted in the step "Adjust parameters" 460. After the adjustment of the parameters in the step "Adjust parameters" 460 the patterning may commence in the step "Start patterning" 470 as it is clear that the adjusted parameters will be right for generating the required pattern 45. Alternatively, from the step "Adjust parameters" 460 the calibration method may generate a next test pattern via the step "Irradiate OLED device" 410 after which the camera will capture a new image which subsequently again will be analyzed in the step "Analyze captured image" 440. In such a manner, the parameters required for generating the pattern 45 may be determined iteratively.

It should be noted that the above-mentioned embodiments illustrate rather than limit the invention, and that those skilled in the art will be able to design many alternative embodiments without departing from the scope of the appended claims.

In the claims, any reference signs placed between parentheses shall not be construed as limiting the claim. Use of the verb "comprise" and its conjugations does not exclude the presence of elements or steps other than those stated in a claim. The article "a" or "an" preceding an element does not exclude the presence of a plurality of such elements. The invention may be implemented by means of hardware comprising several distinct elements. In the device claim enumerating several means, several of these means may be embodied by one and the same item of hardware. The mere fact that certain measures are recited in mutually different dependent claims does not indicate that a combination of these measures cannot be used to advantage.

The invention claimed is:

1. A patterned light emitting diode device comprising:
   a layer of light emitting material;
   a light-emission window; and
   a light-reflective layer being visible through the light-emission window of the patterned light emitting diode device, the light-reflective layer comprising a macroscopic pattern of local deformations in the light-reflective layer, wherein the light-reflective layer is configured to be locally irradiated with electro-magnetic radiation for locally heating the light-reflective layer for locally deforming the light-reflective layer and forming the local deformations.

2. The patterned light emitting diode device as claimed in claim 1, further comprising an anode layer and a cathode layer, wherein light emitting material of the light emitting diode device is arranged between the anode layer and the cathode layer, the anode layer or cathode layer being the light-reflective layer comprising the pattern while substantially maintaining a conductivity of the light-reflective layer parallel to the light-reflective layer.

3. The patterned light emitting diode device as claimed in claim 1, wherein the pattern comprises a plurality of grey-levels, wherein different grey-levels comprises at least one of a different density of the local deformations of the light-reflective layer, and a different height of the deformations of the light-reflective layer, the height being a dimension substantially perpendicular to the light-reflective layer.

4. The patterned light emitting diode device as claimed in claim 1, wherein the light-reflective layer is configured for being locally deformed when irradiated with electro-magnetic radiation having a power below an ablation threshold of any layers of the patterned light emitting diode device.

5. The patterned light emitting diode device as claimed in claim 1, wherein a wavelength of the electro-magnetic radiation for generating the local deformations is in a range between 320 nanometers and 2000 nanometers.

6. The patterned light emitting diode device as claimed in claim 1, wherein the patterned light emitting diode device comprises an anode layer and a cathode layer, and wherein at least a part of the anode layer or the cathode layer is configured to be substantially transparent to the electro-magnetic radiation.

7. The patterned light emitting diode device as claimed in claim 1, wherein the patterned light emitting diode device is sealed in an encapsulation, and wherein at least a part of the encapsulation is configured to be substantially transparent to the electro-magnetic radiation.

8. A system for generating a patterned light emitting diode device, the patterned light emitting diode device comprising:
   a layer of light emitting material;
   a light-emission window; and
   a light-reflective layer being visible through the light-emission window of the patterned light emitting diode device, the light-reflective layer comprising a macroscopic pattern of local deformations in the light-reflective layer, wherein the light-reflective layer is configured to be locally irradiated with electro-magnetic radiation for locally heating the light-reflective layer for locally deforming the light-reflective layer and forming the local deformations.

9. The system of claim 8, comprising:
   a radiation source configured to generate a condensed light beam; and
   a scanner configured to move the condensed light beam across a light emitting diode device for generating the patterned light emitting diode device.

10. The system of claim 9, wherein the system comprising a focusing device including a movable lens configured to control a focus location of the condensed light beam.

11. The system of claim 9, further comprising:
    a controller configured to control an energy level, color and/or scanning speed of the condensed light beam.

12. The system of claim 9, further comprising:
    an input interface configured to accept an input-pattern for being applied on the light emitting diode device to generate the pattern; and
    a converter configured to convert the input-pattern into at least one of:
      a movement of the condensed light beam;
      a spot-size of the condensed light beam;
      an intensity variation of the condensed light beam; and
      a color variation of the condensed light beam for generating the pattern.

13. The system of claim 9, further comprising:
    a calibration device configured to determine at least one of a spot-size of the condensed light beam and a spot-size in the pattern.

14. The system of claim 9, further comprising:
a controller configured to control a patterning speed of the system for generating the patterned light emitting diode device, the controller being further configured to at least one of:
dynamically control a spot-size of the condensed light beam while generating the pattern, the controller being further configured to adapt an output power of the condensed light beam to ensure that a power per illuminated area remains substantially constant;
control a further radiation source configured to generate a further condensed light beam having a different spot-size compared to the condensed light beam of the radiation source, the controller being further configured to dynamically select at least one of the radiation means and the further radiation means while generating the pattern;
control the scanner depending on at least one of the spot-size, the different spot-size, power per illuminated area emitted by at least one of the condensed light beam and the further condensed light beam; and
skip to scan at least one of the condensed light beam and the further condensed light beam across non-image-areas of the light emitting diode device for increasing a patterning speed, wherein the non-image-areas do not require irradiation by the condensed light beam or by the further condensed light beam for generating the pattern.

15. The system of claim 9, further comprising:
a controller configured to control a power per illuminated area per time for preventing damaging the light emitting diode device, the controller being further configured to at least one of:
scan at least one of the condensed light beam and a further condensed light beam, generated by a further radiation source, in a line-by-line scanning mode in a uni-directional scanning direction or bidirectional scanning direction at a substantially constant scanning speed across a scan-area while modulating a power of at least one of the radiation source and the further radiation source for controlling the power per illuminated area per time for generating the pattern, the scan-area being an area of the light emitting diode device which is scanned for generating the pattern;
reverse a scan-direction outside the scan-area in the line-by-line scanning mode for ensuring the scan-speed within the scan-area is equal to a required scan-speed; and
at least one of skip a predefined number of scan-lines in the line-by-line scanning mode between a previous scan-line and a current scan-line, and apply a scan-delay before initializing a next scan across the scan-area for controlling the power per illuminated area per time for generating the pattern.

\* \* \* \* \*